United States Patent
Sugiyama et al.

(10) Patent No.: US 8,598,605 B2
(45) Date of Patent: Dec. 3, 2013

(54) SEMICONDUCTOR LIGHT-EMITTING DEVICE

(75) Inventors: Naoharu Sugiyama, Kanagawa-ken (JP); Taisuke Sato, Kanagawa-ken (JP); Kotaro Zaima, Tokyo (JP); Jumpei Tajima, Tokyo (JP); Toshiki Hikosaka, Kanagawa-ken (JP); Yoshiyuki Harada, Tokyo (JP); Hisashi Yoshida, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,454

(22) Filed: Aug. 31, 2012

(65) Prior Publication Data
US 2013/0234106 A1 Sep. 12, 2013

(30) Foreign Application Priority Data
Dec. 12, 2011 (JP) ................. 2011 271560

(51) Int. Cl.
*H01L 33/00* (2010.01)
*H01L 21/00* (2006.01)

(52) U.S. Cl.
USPC ............... 257/94; 257/13; 257/615; 438/47

(58) Field of Classification Search
None
See application file for complete search history.

(56) References Cited

U.S. PATENT DOCUMENTS

| | | | |
|---|---|---|---|
| 6,420,197 B1* | 7/2002 | Ishida et al. | 438/22 |
| 7,547,925 B2* | 6/2009 | Wong et al. | 257/103 |
| 2003/0132448 A1* | 7/2003 | Tsujimura et al. | 257/101 |
| 2005/0236641 A1* | 10/2005 | Goetz et al. | 257/101 |
| 2012/0146045 A1* | 6/2012 | Sugiyama et al. | 257/76 |

FOREIGN PATENT DOCUMENTS

| | | |
|---|---|---|
| JP | 2000-311863 | 11/2000 |
| JP | 2006-303154 | 11/2006 |
| JP | 2009-70872 | 4/2009 |

OTHER PUBLICATIONS

Japanese Office Action issued Sep. 18, 2012, in Japan Patent Application No. 2011-271560 (with English translation).
U.S. Appl. No. 13/222,238, filed Aug. 31, 2011, Taisuke Sato, et al.
U.S. Appl. No. 13/779,978, filed Feb. 28, 2013, Sugiyama, et al.

* cited by examiner

*Primary Examiner* — Evan Pert
*Assistant Examiner* — Andres Munoz
(74) *Attorney, Agent, or Firm* — Oblon, Spivak, McClelland, Maier & Neustadt, L.L.P.

(57) ABSTRACT

According to one embodiment, a semiconductor light-emitting device includes: a first conductivity type first semiconductor layer containing a nitride semiconductor crystal and having a tensile stress in a (0001) surface; a second conductivity type second semiconductor layer containing a nitride semiconductor crystal and having a tensile stress in the (0001) surface; a light emitting layer provided between the first semiconductor layer and the second semiconductor layer, containing a nitride semiconductor crystal, and having an average lattice constant larger than the lattice constant of the first semiconductor layer; and a first stress application layer provided on a side opposite to the light emitting layer of the first semiconductor layer and applying a compressive stress to the first semiconductor layer.

20 Claims, 7 Drawing Sheets

SEMICONDUCTOR LIGHT-EMITTING DEVICE

CROSS-REFERENCE TO RELATED APPLICATIONS

This application is based upon and claims the benefit of priority from the prior Japanese Patent Application No. 2011-271560, filed on Dec. 12, 2011; the entire contents of which are incorporated herein by reference.

FIELD

Embodiments described herein relate generally to a semiconductor light-emitting device.

BACKGROUND

Nitride semiconductors are used for semiconductor light-emitting devices, and high-performance devices have been put into practice.

However, if a semiconductor light-emitting device is formed by epitaxial growth of a nitride semiconductor crystal on a silicon substrate which is less expensive than a sapphire substrate and is more efficient in a manufacturing process, a crack or a defect might be caused by a tensile stress contained in the inside of an epitaxial crystal layer. That might cause a failure in a device fabrication process or deteriorate device characteristics. Realization of a semiconductor light-emitting device in which deterioration of the device characteristics involved in occurrence of a crack or introduction of a defect in the middle of the process caused by the tensile stress is suppressed and light emitting efficiency is high has been in demand.

BRIEF DESCRIPTION OF THE DRAWINGS

FIGS. 4A to 5C are cross-sectional schematic diagrams illustrating a process of fabricating a semiconductor light-emitting device structure illustrated in FIG. 3;

DETAILED DESCRIPTION

In general, according to one embodiment, a semiconductor light-emitting device includes: a first conductivity type first semiconductor layer containing a nitride semiconductor crystal and having a tensile stress in a (0001) surface; a second conductivity type second semiconductor layer containing a nitride semiconductor crystal and having a tensile stress in the (0001) surface; a light emitting layer provided between the first semiconductor layer and the second semiconductor layer, containing a nitride semiconductor crystal, and having an average lattice constant larger than the lattice constant of the first semiconductor layer; and a first stress application layer provided on a side opposite to the light emitting layer of the first semiconductor layer and applying a compressive stress to the first semiconductor layer.

Exemplary embodiments of the invention will now be described in detail with reference to the drawings.

The drawings are schematic or conceptual, and a relationship between the thickness and the width of each portion, a ratio in size of portions and the like are not necessarily the same as actual ones. Also, even if the same portions are indicated, dimensions and ratios might be expressed differently depending on the drawings.

The same elements in this specification and in the drawings as those already described in the drawings having been illustrated are given the same reference numerals, for which detailed description will be omitted as appropriate, and different portions will be described as appropriate.

Figure 1:
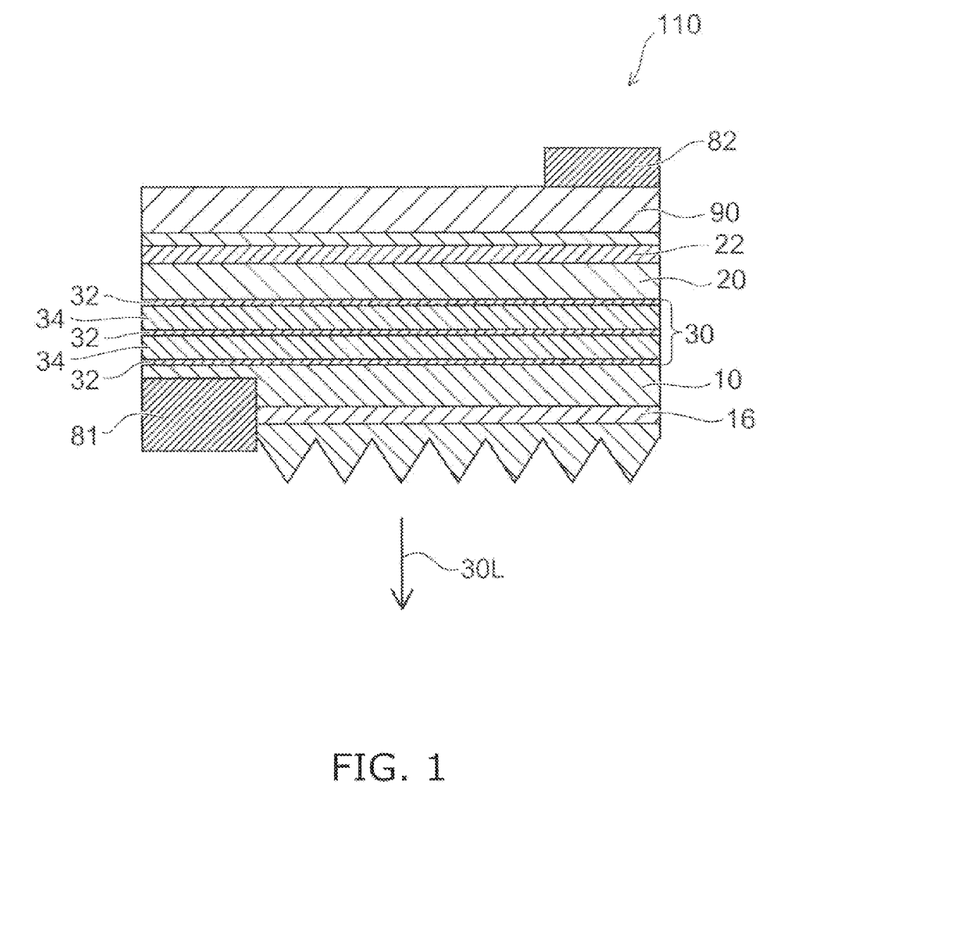
FIG. 1 is a cross-sectional schematic diagram exemplifying a configuration of a semiconductor light-emitting device according to an embodiment.

FIG. 1 is a cross-sectional schematic diagram exemplifying a configuration of a semiconductor light-emitting device according to an embodiment.

As illustrated in FIG. 1, a semiconductor light-emitting device 110 according to the embodiment includes a first conductivity type first semiconductor layer 10, a second conductivity type second semiconductor layer 20, a light emitting layer 30, and a first stress application layer 16. The semiconductor light-emitting device 110 is an LED device, for example. The semiconductor light-emitting device 110 may be a laser diode. In the following explanation, it is assumed that the semiconductor light-emitting device 110 is an LED.

An n-type semiconductor layer, for example, is used for the first semiconductor layer 10. A p-type semiconductor layer, for example, is used for the second semiconductor layer 20. However, the first semiconductor layer 10 may be of the p-type and the second semiconductor layer 20 may be of the n-type. In the following explanation, it is assumed that the first semiconductor layer 10 is of the n-type, and the second semiconductor layer 20 is of the p-type.

The first semiconductor layer 10 and the second semiconductor layer 20 contain nitride semiconductor crystals. As will be described later, each of the first semiconductor layer 10 and the second semiconductor layer 20 has a tensile stress in a (0001) plane.

The first semiconductor layer 10 is an n-type GaN layer, for example. The second semiconductor layer 20 is a p-type GaN layer, for example. The first semiconductor layer 10 may contain an i-GaN layer (hereinafter also referred to as "non-doped GaN layer") and an n-type GaN layer, for example. An n-type GaN layer is arranged between the i-GaN layer and the second semiconductor layer 20.

The light emitting layer 30 is provided between the first semiconductor layer 10 and the second semiconductor layer 20. The light emitting layer 30 contains a nitride semiconductor crystal. An average lattice constant in the light emitting layer 30 is larger than the lattice constant of the first semiconductor layer 10.

The light emitting layer 30 includes a plurality of barrier layers 34 and a well layer 32 provided between the barrier layers 34, for example. The well layer 32 may be provided in plural. For example, the light emitting layer 30 has a MQW (Multiple Quantum Well) structure.

The average lattice constant in the light emitting layer 30 is a lattice constant obtained by weighting the lattice constant of the barrier layer 34 and the lattice constant of the well layer 32 with weight distribution and averaging the result.

The first stress application layer 16 contacts with the first semiconductor layer on the surface opposite to the light emitting layer 30 of the first semiconductor layer 10. The first stress application layer 16 applies a compressive stress to the first semiconductor layer 10. The first stress application layer 16 contacts with the first semiconductor layer 10, for example. If the first semiconductor layer 10 contains the i-GaN layer and the n-type GaN layer, for example, the first stress application layer 16 may be joined to the n-type GaN layer through the i-GaN layer.

In the example, the semiconductor light-emitting device 110 also includes a second stress application layer 22. The second stress application layer 22 is provided on the side opposite to the light emitting layer 30 of the second semiconductor layer 20. The second stress application layer 22 contacts with the second semiconductor layer 20, for example. The second stress application layer 22 applies a compressive stress to the second semiconductor layer 20. The stress will be described later.

In the example, the semiconductor light-emitting device 110 further includes a first electrode 81, a second electrode 82, and a reflective metal 90. To an LED layered structure including the second semiconductor layer 20, the light emitting layer 30, and the first semiconductor layer 10, the reflective metal 90 containing Ni on the p-type layer side and a support substrate including an Si substrate through an electrode film containing AuSn are joined. The support substrate will be described later.

As indicated by an arrow 30L illustrated in FIG. 1, light emitted from the light emitting layer 30 is projected from a major surface (light extraction surface) on the side of the first semiconductor layer 10. In other words, the light emitted from the light emitting layer 30 is projected to the outside of the semiconductor light-emitting device 110 through the first semiconductor layer 10 and the first stress application layer 16. As described above, the major surface of the first semiconductor layer 10 is a light extraction surface. The light emitting surface has concavo-convex shape surface by roughening procedure. The LED layered structure of the nitride semiconductor crystal is formed between the second semiconductor layer 20 and the light extraction surface.

The first semiconductor layer 10 is made of an n-type gallium nitride (GaN) crystal, for example. On the first semiconductor layer 10, the light emitting layer 30 formed of a multilayer film of the well layer 32 and the barrier layer 34 is laminated. The well layer 32 includes InGaN, for example. The barrier layer 34 includes GaN, for example. The second semiconductor layer 20 is laminated on the quantum well structure of a nitride semiconductor which becomes the light emitting layer 30. The second semiconductor layer 20 is made of a p-type gallium nitride crystal, for example.

The lattice constant of the InGaN crystal layer (well layer 32) included in the light emitting layer 30 is larger than the lattice constant of the gallium nitride (first semiconductor layer 10). The semiconductor light-emitting device 110 has a structure formed of a first nitride semiconductor crystal (a GaN crystal which becomes the first semiconductor layer 10 and the second semiconductor layer 20, for example) as a base material and a second nitride semiconductor crystal (InGaN layer which becomes the well layer 32) having a lattice constant larger than the lattice constant of the first nitride semiconductor crystal inside the base material.

An a-axis length (lattice spacing in the a-axis direction) of the lattice of the first semiconductor crystal layer is longer than the intrinsic lattice constant in the a-axis direction of the hexagonal GaN crystal. That is, a tensile stress is applied to the first semiconductor crystal layer (the first semiconductor layer 10 and the second semiconductor layer 20). An average a-axis length of the lattice of the light emitting layer 30 (a laminated body of the well layer 32 made of InGaN and the barrier layer 34 made of GaN, for example) is longer than the a-axis length in the lattice of the first semiconductor crystal. The magnitude of the tensile stress applied to the GaN layer can be evaluated by the Raman spectroscopy technique as will be described later.

Figure 2A:
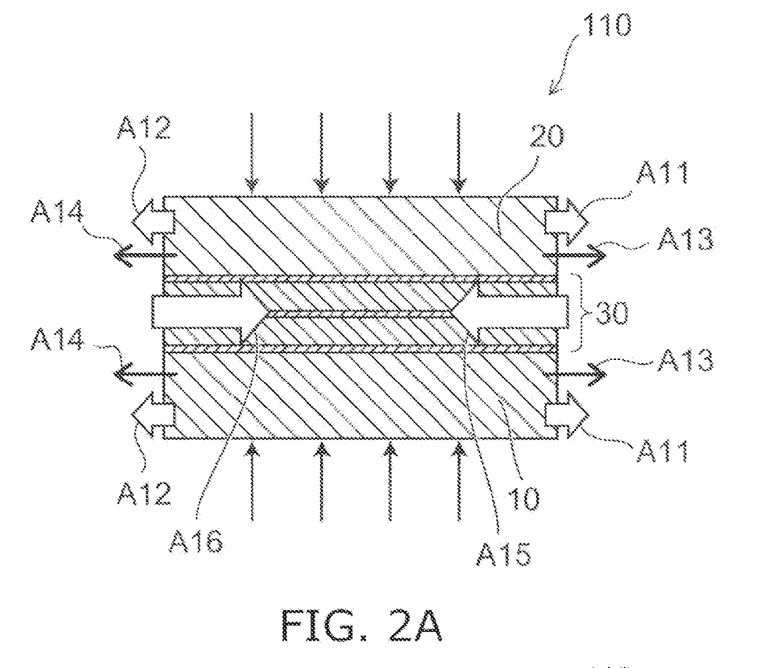
FIGS. 2A and 2B are cross-sectional schematic diagrams illustrating a stress generated in a layered structure.
Figure 2B:
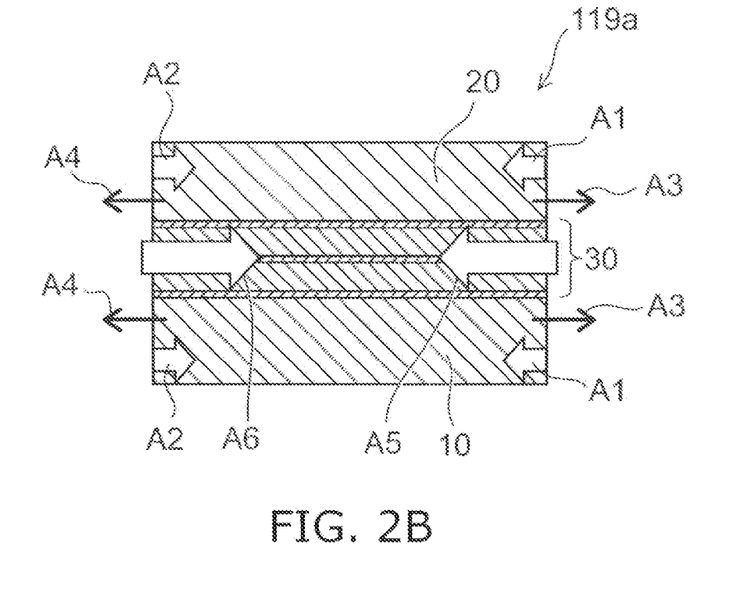

FIGS. 2A and 2B are cross-sectional schematic diagrams illustrating a stress generated in a layered structure.

FIG. 2A exemplifies a stress generated in the LED layered structure of the semiconductor light-emitting device 110 according to the embodiment. FIG. 2B exemplifies a stress generated in the LED layered structure of a semiconductor light-emitting device of a reference example.

As illustrated in FIG. 2B, in the semiconductor light-emitting device according to the reference example, a gallium nitride crystal layer similarly having the (0001) surface as the front surface is formed on a sapphire substrate having the (0001) surface as the front surface, and a light emitting layer made of an In—GaN thin-film crystal layer is further combined. Each semiconductor crystal of a semiconductor light-emitting device 119a of the reference example formed on the sapphire substrate having the (0001) surface as the front surface is oriented in a c-axis direction.

A light emitting diode in which a nitride semiconductor crystal layer is laminated on a sapphire substrate as in the semiconductor light-emitting device 119a has a structure in which an n-type GaN layer (the first semiconductor layer 10), a quantum well type light emitting layer (the light emitting layer 30), and a p-type GaN layer (the second semiconductor layer 20) are laminated on a sapphire substrate, not shown. The sapphire substrate is substantially transparent to a wavelength band of a blue area, which is major target in this article. Thus, a structure (Face-up structure) in which a reflective film is formed on a back surface of the sapphire substrate and then, light is extracted from an upper part of the p-type GaN layer on the front surface side, for example, is employed.

On the other hand, a measure against heat generation should be taken under an operation condition in which higher light output is required at and current injection is increased. Therefore, a structure (Thin-film structure) in which, after the LED structure made of a nitride semiconductor is epitaxially grown on the sapphire substrate and then, the front surface side of the p-type GaN layer is bonded to the support substrate having high heat conductivity, and the sapphire substrate is separated, for example, is employed.

In an LED using gallium nitride epitaxially grown on the sapphire substrate, a lattice spacing of the sapphire crystal on which a gallium nitride crystal grows epitaxially is smaller than the lattice constant of gallium nitride. Moreover, a thermal expansion coefficient of the gallium nitride crystal is smaller than the thermal expansion coefficient of a sapphire crystal which becomes a base substrate. Thus, a large compressive stress as an arrow A1 and an arrow A2 illustrated in FIG. 2B is applied on the gallium nitride crystal layer when thin-film crystal growth at a high temperature is completed, and the temperature is lowered to a room temperature.

Moreover, the lattice constant of the InGaN crystal layer which becomes the light emitting layer 30 is larger than the lattice constant of the gallium nitride. Thus, as an arrow A3 and an arrow A4 illustrated in FIG. 2B, a stress (tensile stress) in a direction pulling from the InGaN crystal layer is applied to the gallium nitride crystal layer to which the compressive stress from the sapphire crystal is applied. On the other hand, the light emitting layer 30 receives the compressive stress from the gallium nitride crystal layer as an arrow A5 and an arrow A6 illustrated in FIG. 2B. Such compressive stress and tensile stress are generated in the (0001) surface or in other words, in the a-axis direction, for example.

As described above, the tensile stress applied from the InGaN crystal layer having the lattice constant larger than the lattice constant of gallium nitride to the gallium nitride crystal layer is relatively balanced with the compressive stress applied from the sapphire crystal to the gallium nitride crystal layer. Thus, few defects introduced from the end surface of the n-type GaN layer or the end surface of the p-type GaN layer.

According to findings of the inventor, it is known that the compressive stress and the tensile stress applied to the gallium nitride crystal layer still remain in the Thin-film structure from which the sapphire substrate is removed. This also is similar in the Thin-film structure separated from a silicon substrate which will be described later relating to FIG. 2A. Moreover, whether the stress applied to the gallium nitride crystal layer is a compressive stress or a tensile stress can be determined from the Raman spectroscopy. For example, a peak in the Raman spectrum in a gallium nitride crystal to which a stress is not applied is approximately 568 cm$^{-1}$, but it is a wavenumber smaller than 568 cm$^{-1}$ in the gallium nitride crystal to which the compressive stress is applied, which is approximately 567.8 to 565.5 cm$^{-1}$, for example, and it is a wavenumber larger than 568 cm$^{-1}$ or a value up to approximately 570 cm$^{-1}$ in the gallium nitride crystal to which the tensile stress is applied.

As illustrated in FIG. 2A, the semiconductor light-emitting device 110 according to the embodiment has the LED layered structure formed on a silicon crystal having a (111) surface, not shown, as the front surface and in which the n-type GaN layer (the first semiconductor layer 10), the quantum well type light emitting layer (the light emitting layer 30), and the p-type GaN layer (the second semiconductor layer 20) are laminated. Also, each semiconductor crystal of the semiconductor light-emitting device 110 formed on the silicon substrate having the (111) surface as the front surface is oriented in the c-axis direction.

In order to use a substrate which is less expensive than the sapphire substrate and has a relatively large area by which the manufacturing process becomes efficient, growth of the gallium nitride crystal on the silicon crystal is tried. When the semiconductor light-emitting device is to be fabricated by using a nitride crystal grown on the silicon substrate as a base material, the silicon substrate is not transparent to the wavelength of the visible light. Thus, the Thin-film structure in which a growth layer is separated from the silicon substrate is used.

An equivalent lattice spacing of silicon on which a gallium nitride crystal grows epitaxially is larger than the lattice constant of gallium nitride. Moreover, the thermal expansion coefficient of the silicon crystal is smaller than the thermal expansion coefficient of gallium nitride. Thus, the tensile stress remains as an arrow A11 and an arrow A12 illustrated in FIG. 2A in the gallium nitride crystal layer after crystal growth is finished. Moreover, in the nitride semiconductor crystal system formed on the silicon crystal, further tensile stress is applied from the InGaN light emitting layer 30 as an arrow A13 and an arrow A14 illustrated in FIG. 2A. On the other hand, the light emitting layer 30 receives a compressive stress from the gallium nitride crystal layer as arrows A15 and A16 illustrated in FIG. 2A. Such compressive stress and tensile stress occur within the (0001) surface or in other words, in the a-axis direction, for example.

As described above, in the semiconductor light-emitting device 110 according to the embodiment, the tensile stress applied from the InGaN crystal layer having a lattice constant larger than the lattice constant of gallium nitride synergizes with the tensile stress applied from the silicon crystal to the gallium nitride crystal layer. Thus, if the nitride semiconductor crystal is epitaxially grown on the silicon substrate so as to form a semiconductor light-emitting device, a crack or a defect can easily occur due to the tensile stress contained inside the epitaxial crystal layer. Then, that might cause a failure in the device fabrication process or deteriorate the device characteristics.

Moreover, if In composition in the light emitting layer 30 is high and an average lattice constant of the light emitting layer 30 is large, a tensile stress applied from the InGaN crystal layer to the gallium nitride crystal layer is thick, and a failure occurring in the device fabrication process is remarkable. Moreover, if the thickness of the InGaN crystal layer is large, too, the failure occurring in the device fabrication process is remarkable.

On the other hand, in the semiconductor light-emitting device 110 according to the embodiment, as illustrated in FIG. 1, as illustrated in FIG. 1, the first stress application layer 16 provided on the end portion of the first semiconductor layer 10 and the second stress application layer 22 provided on the end portion of the second semiconductor layer 20 are prepared. As a result, the first stress application layer 16 and the second stress application layer 22 apply the compressive stress on the first semiconductor layer 10 and the second semiconductor layer 20, that is, the first semiconductor crystal layer as a base material layer.

The first stress application layer 16 includes an AlN layer, for example. The first stress application layer 16 may include a plurality of AlN layers, not limited to inclusion of a single AlN layer. Moreover, the first stress application layer 16 may also include an AlGaN layer.

The second stress application layer 22 includes an AlGaN layer. Moreover, the second stress application layer 22 may include an AlN layer.

According to the semiconductor light-emitting device 110 according to the embodiment, even under the condition in which the tensile stress is applied to the first semiconductor crystal as the base material, the first stress application layer 16 and the second stress application layer 22 can apply the compressive stress to the first semiconductor crystal layer. Thus, occurrence of a crack or introduction of a defect can be suppressed, and a semiconductor light-emitting device with high light-emitting efficiency can be provided.

For example, as described above relating to FIG. 2A, in the device structure in which the thin-film crystal (first semiconductor crystal) including the tensile stress further includes the light emitting layer 30 which applies the tensile stress, the first stress application layer 16 and the second stress application layer 22 which apply the compressive stress to the both end surfaces of the first semiconductor crystal layer and second semiconductor crystal layer are arranged. Thus, deterioration of the device characteristics involved in occurrence of a crack or introduction of a defect in the middle of the process caused by the tensile stress can be suppressed.

Moreover, in the Thin-film structure separated from the silicon substrate, the major surface (light extraction surface) of the first semiconductor layer 10 is an open end (open surface). Thus, if the first stress application layer 16 and the second stress application layer 22 are not provided, no stress is applied to the major surface (light extraction surface) of the first semiconductor layer 10 which is an open surface. In such an open surface, a failure caused by the tensile stress included inside the epitaxial crystal layer hardly occurs. On the other hand, in the semiconductor light-emitting device 110 according to the embodiment, since the first stress application layer 16 and the second stress application layer 22 are provided, even if the major surface (light extraction surface) of the first semiconductor layer 10 is an open end, the compressive stress is applied to the first semiconductor crystal layer.

Figure 3:
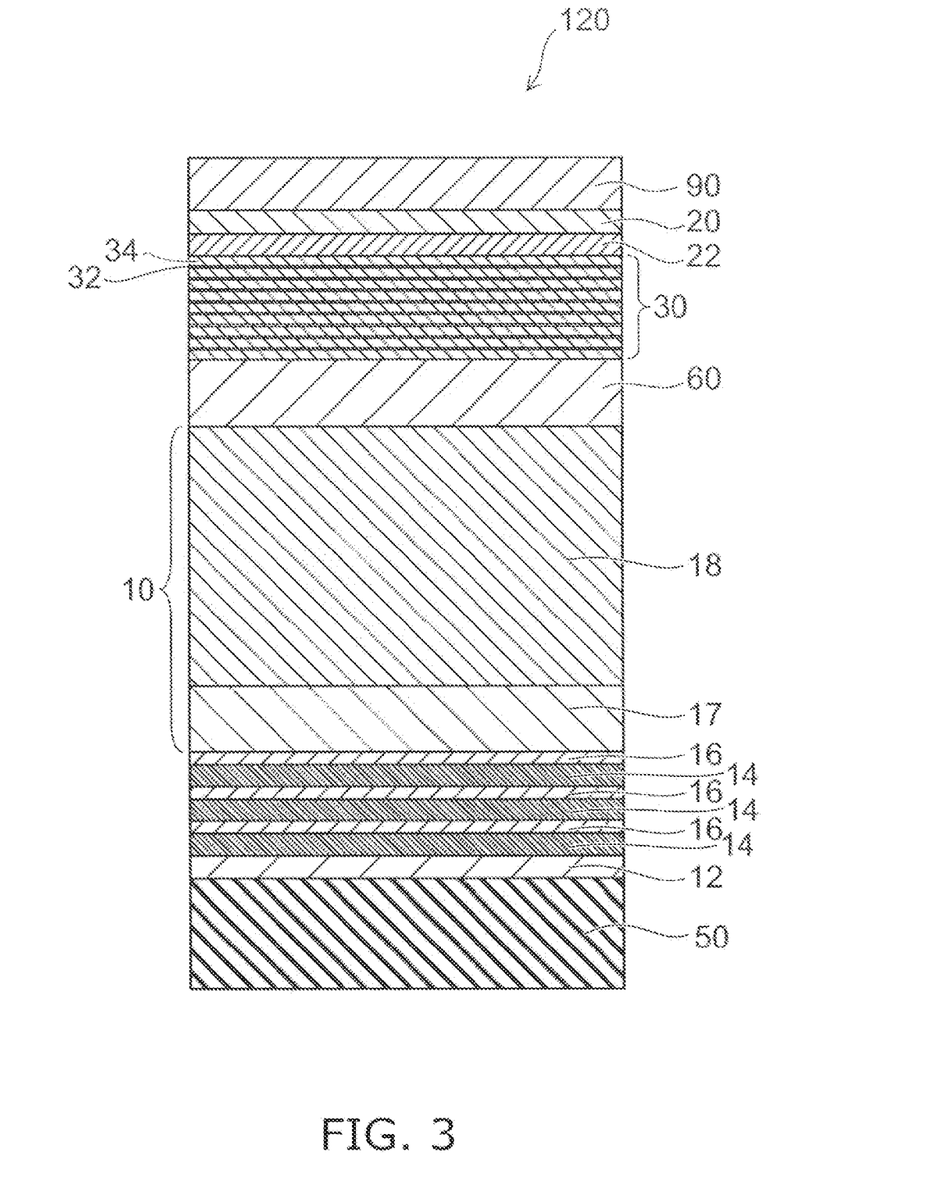
FIG. 3 is a cross-sectional schematic diagram illustrating an example of a crystal layered structure when the semiconductor light-emitting device according to the embodiment is fabricated.

FIG. 3 is a cross-sectional schematic diagram illustrating an example of a crystal layered structure when the semiconductor light-emitting device according to the embodiment is fabricated.

As illustrated in FIG. 3, in a semiconductor light-emitting device 120 according to the embodiment, a buffer layer 12 having an AlN layer and an AlGaN layer is arranged on a silicon substrate 50. On the buffer layer 12, an AlN layer (first stress application layer) 16 having a thickness of 15 nm is provided repeatedly three times while sandwiching a non-doped barrier layer 14 having a thickness of 300 nanometers (nm). On the AlN layer 16, the first semiconductor layer 10 is laminated. On the first semiconductor layer 10, an n-type GaN layer 18 having a thickness of 2 micrometers (μm) and a non-doped GaN layer 17 having a thickness of 1 μm are laminated.

On the n-type GaN layer 18, an SLS (Super lattice structure) layer 60 having a structure formed by repeating a GaN layer made of GaN and having a thickness of 3 nm and an InGaN layer having In composition of 7% and a thickness of 1 nm 30 times is arranged. On the SLS layer 60, the MQW light emitting layer 30 is laminated. The MQW light emitting layer 30 has a structure formed by repeating a barrier layer 34 made of GaN and having a thickness of 5 nm and a well layer 32 made of an InGaN layer having In composition of 15% and a thickness of 3 nm 8 times. In the semiconductor light-emitting device 120 of the embodiment, a composition ratio of In in the well layer 32 is 0.12 or more and 0.20 or less, for example.

On the light emitting layer 30, a p-type AlGaN layer (second stress application layer 22) having Al composition of 20% is arranged. On the p-type AlGaN layer (second stress application layer 22), a p-type GaN layer (the second semiconductor layer 20) is arranged. On the p-type GaN layer (the second semiconductor layer 20), reflective metal 90 is arranged.

Subsequently, an example of a fabrication process of the semiconductor light-emitting device 120 will be described.

FIGS. 4A to 5C are cross-sectional schematic diagrams illustrating a process of fabricating a semiconductor light-emitting device structure illustrated in FIG. 3.

Figure 4A:
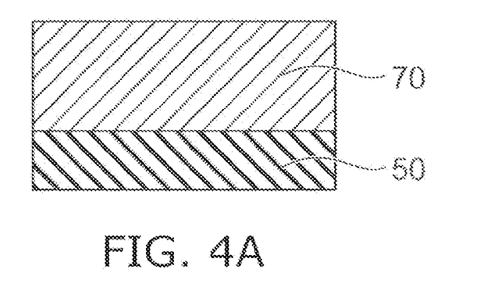

First, as a substrate for growing a crystal of a thin-film nitride semiconductor, the silicon substrate 50 having the (111) surface as a front surface is prepared. A thickness of a crystal of the silicon substrate 50 is approximately 525 μm, for example. However, the thickness of the crystal of the silicon substrate 50 is not limited to that but may be approximately 250 to 800 μm, for example.

The surface of the Si substrate 50 placed in the atmosphere in general is covered by a native oxide layer. Thus, in order to remove this native oxide layer and to apply hydrogen-termination treatment to the substrate surface, acid treatment washing is applied. After that, the substrate for thin-film growth is subjected to treatment with diluted hydrofluoric solution having concentration of approximately 1% for approximately 1 minute. The silicon crystal surface is terminated by hydrogen atoms as called "Hydrogen termination" and becomes a water-repellent surface.

Subsequently, the Si substrate 50 whose surface is hydrogen-terminated is introduced into a film deposition apparatus (MOCVD apparatus) using organic metal and ammonia gas as source materials, and an AlN layer having a thickness of 100 nm is grown at a film deposition temperature of 1200° C. The example using the MOCVD apparatus for film deposition an AlN layer is described here, but selection of a film deposition method is optional. As the film deposition apparatus of the AlN layer, an ECR plasma sputter apparatus or an MBE apparatus may be used.

If film formation of the AlN layer on the Si substrate 50 is performed by those other than the MOCVD apparatus, the substrate is introduced into the MOCVD apparatus after the film formation of the AlN layer, followed by the following film deposition process.

After the AlN layer having a thickness of 100 nm is grown on the Si substrate 50, the substrate temperature is set to 1100° C., and an AlGaN layer having Al composition of 25% and a thickness of 250 nm is grown.

The AlN layer and the AlGaN layer formed as above correspond to the buffer layer 12 in FIG. 3.

After that, a gallium nitride layer 14 of 0.3 μm is formed using TMG (trimethylgallium) and $NH_3$ (ammonia) as source materials. After the gallium nitride layer 14 of 0.3 μm is grown, the film deposition temperature is lowered to 700° C., and the AlN layer 16 (the first stress application layer) having a thickness of 15 nm is grown. Moreover, the barrier layer 14 having a thickness of 300 nm is grown again at the film deposition temperature of 1100° C. As described above, while the barrier layer 14 of 300 nm is sandwiched, the AlN layer 16 grown at a low temperature is inserted three times.

Subsequently, the n-type GaN (first semiconductor layer) 10 is grown. At this time, Si is added to the n-type GaN 10 with the concentration of $1\times10^{19}$ $cm^{-2}$ as an impurity. Here, as illustrated in FIG. 3, instead of direct formation of the n-type GaN 10 on the AlN layer 16, the barrier layer (non-doped barrier layer) 17 not containing an impurity may be grown to the thickness of approximately 1 to 3 μm and then, the n-type GaN layer 18 may be laminated. That is, the first semiconductor layer 10 may have a structure in which the non-doped GaN layer 17 and the n-type GaN layer 18 are laminated.

After the growth of the n-type GaN 10, the SLS layer 60 made of a multilayer film of InGaN and GaN and the light emitting layer (MQW light emitting layer) 30 are laminated on this n-type gallium nitride crystal layer 10. Moreover, in order to inject a current for making the light emitting layer 30 illuminate, a p-type (Mg) is doped on the upper part side of the crystal structure. At this time, the AlGaN layer 22 (second stress application layer) having Al composition of 20% and the p-type GaN (first semiconductor layer) 20 not containing Al are formed on the light emitting layer 30.

Here, the metalorganic chemical vapor deposition method (MOCVD method) is used as a method of thin-film crystal growth of the n-type GaN crystal layer 10, the light emitting layer 30, and the p-type GaN 20, but this is not limiting. The method of thin-film crystal growth of the n-type GaN crystal layer 10, the light emitting layer 30, and the p-type GaN 20 may be any method including the Molecular Beam Epitaxy method (MBE) which is a thin-film crystal growth method used for nitride semiconductor crystal growth in general, a Hydride Vapor Phase Epitaxy method (HVPE) and the like.

Figure 4B:
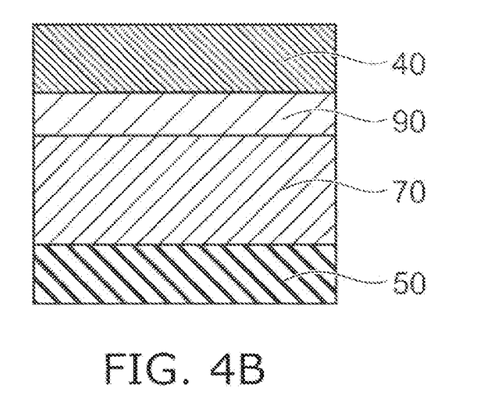

As described above, as illustrated in FIG. 4A, a thin-film crystal layer (crystal growth layer) 70 having the LED structure may be epitaxially grown. After that, as illustrated in FIG. 4B, a metal film (the reflective metal 90) containing Ag as a reflective film and contact layer such as a silver nickel layer, for example, is laminated on the surface of the second semiconductor layer 20 and then, junction metal (gold tin alloy, for example) is sandwiched and bonded to a conductive support substrate 40 such as silicon or copper.

Figure 4C:
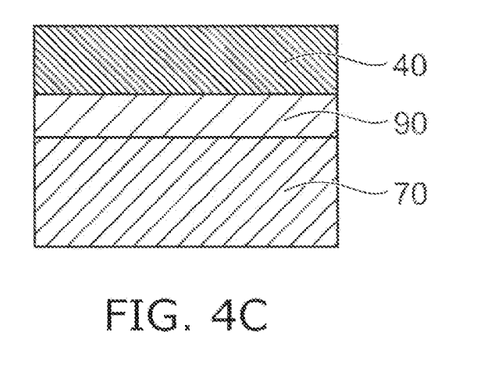

Subsequently, as illustrated in FIG. 4C, the Si substrate 50 which is a substrate for thin-film crystal growth is removed.

After the support substrate 40 is bonded to the second semiconductor layer 20 side, it is possible to remove the Si substrate 50 for growth by grinding the growth substrate. At this time, after the Si substrate 50 is mostly removed by grinding, the slightly remaining Si is removed by dry etching using $SF_6$ gas as an etchant in the end, so that the AlN layer (buffer layer 12) which is formed on the Si substrate at first 50 can be exposed.

Here, the AlN layer has a relatively high specific resistance, which raises series resistance of diode. Thus, in the semiconductor light-emitting device having the above-described layered structure regarding FIG. 3, for example, an AlN buffer layer (the buffer layer 12 including the AlN layer, for example) and an AlN stress application layer (the first stress application layer 16 including the AlN layer, for example) are removed, and the n-type GaN layer 18 is exposed and then, roughening procedure (See FIG. 1) is applied in an example.

In addition, the AlN buffer layer or the AlN stress application layer has high contact resistance if electrode formation is considered. Moreover, a series resistance component increases as mentioned above. Thus, in a general process, the AlN buffer layer and the AlN stress application layer are removed and the n-type GaN layer 18 is exposed and then, the roughening procedure is applied. In this case, it is not possible to apply the compressive stress to the first semiconductor crystal layer, and a failure caused by the tensile stress can easily occur. In an experiment conducted by the inventor, if the silicon substrate 50 (substrate for epitaxial growth) is removed and then, the AlN buffer layer (the buffer layer 12 including the AlN layer, for example) and the AlN stress application layer (the first stress application layer 16 including the AlN layer, for example) are removed and then, the n-type GaN layer 18 is exposed, it is known that a new crack with density of approximately 2 to 20 $cm^{-1}$ occurs at an interval of 5 to 0.5 millimeter (mm) is caused by the tensile stress applied to the n-type GaN layer 18. Moreover, since the device temperature rises while the LED is actually operated, a new crack or defect occurs even while the device is operating in a structure in which the first stress application layer 16 is not provided, and the device characteristics might be deteriorated.

On the other hand, in the semiconductor light-emitting device of the embodiment, the AlN stress application layer is not removed but remains (See the "first stress application layer 16" illustrated in FIG. 1, for example). Thus, the compressive stress can be applied to the first semiconductor crystal layer, and occurrence of a failure caused by the tensile stress can be suppressed.

Figures 5A, 5B:
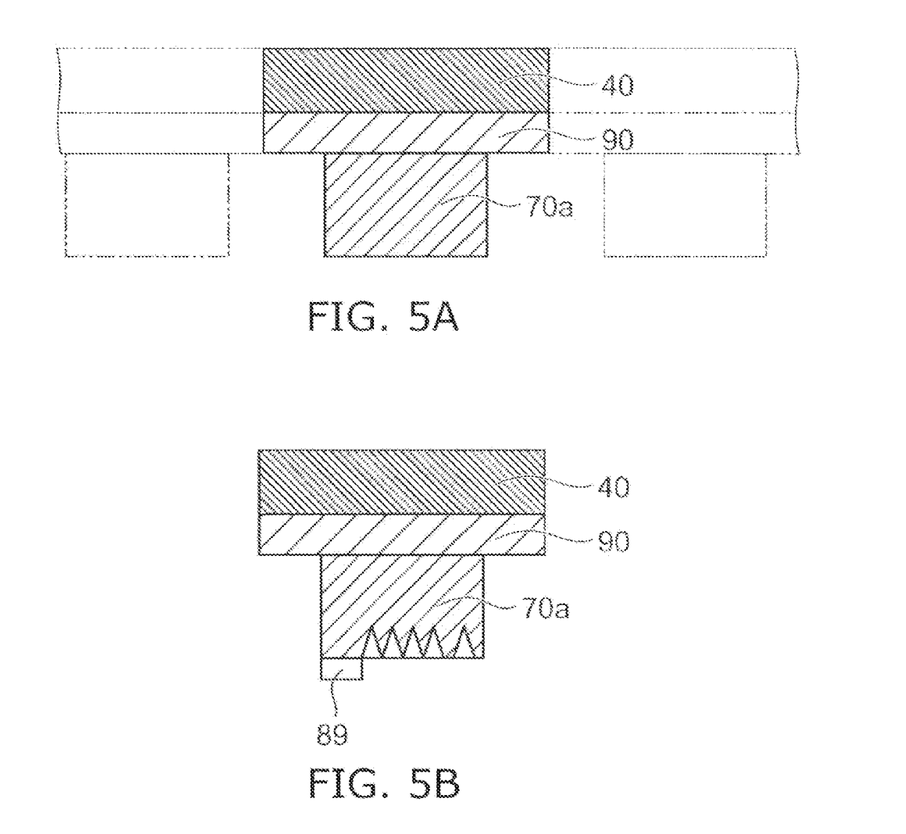

After that, as illustrated in FIG. 5A, the crystal growth layer 70 is divided into a nitride semiconductor crystal layer portion 70a having the size of the device. At this time, the substrate side lower than the p-type electrode (the second electrode 82) metal is maintained in a non-divided state. Subsequently, as illustrated in FIG. 5B, a portion on which an n-side electrode (the first electrode 81) is to be formed is protected by a mask 89 and then, the roughening procedure having a depth of approximately 500 nm is applied on the side of the nitride semiconductor surface (the first semiconductor layer 10) with a KOH solution. At this time, the AlN and AlGaN layer (the buffer layer 12) exposed to the surface is removed by etching. Moreover, regarding the three layers of the AlN layers 16 contained inside the crystal growth layer 70 (the nitride semiconductor crystal layer portion 70a), for example, the uppermost layer (the layer on the side of the nitride semiconductor surface) is separated by the roughening procedure on the nitride semiconductor surface, while the two layers of the AlN layers 16 on the lowermost layer are left as a continuous film on the side lower than a recess part. This will be described later in detail.

Figure 5C:
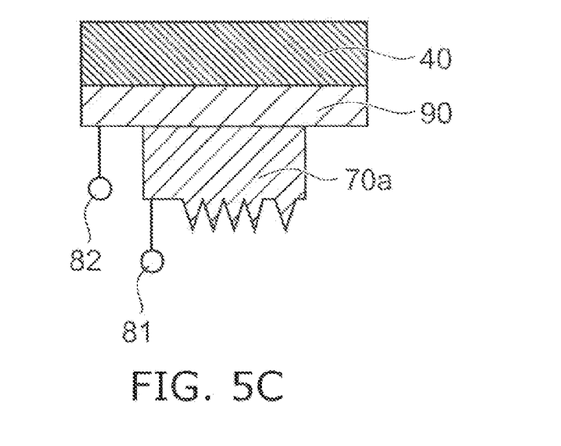

Lastly, as illustrated in FIG. 5C, the mask 89 protecting an n-type electrode forming area is removed, the n-type GaN is exposed by etching, and an n-type electrode is formed.

Subsequently, another example of the semiconductor light-emitting device according to the embodiment will be described by referring to the attached drawings.

Figure 6A:
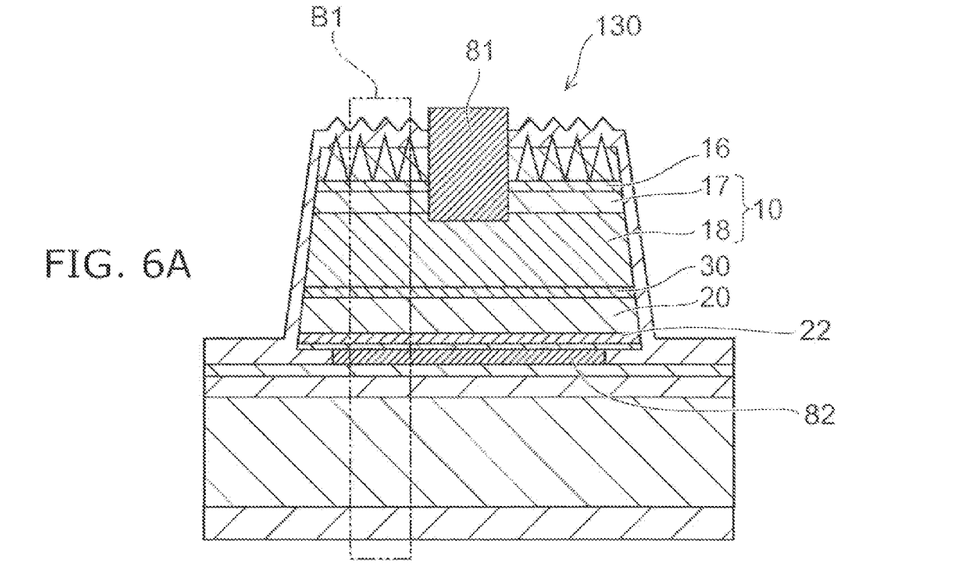
FIGS. 6A and 6B are cross-sectional schematic diagram and a photo illustrating another example of the semiconductor light-emitting device according to the embodiment.
Figure 6B:
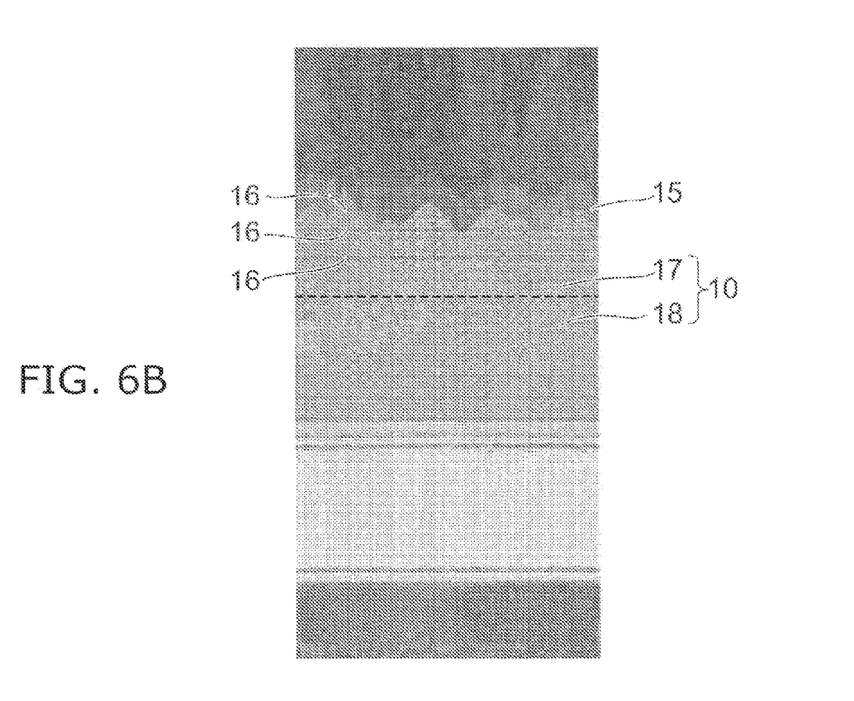

FIGS. 6A and 6B are a cross-sectional schematic diagram and a photo illustrating another example of the semiconductor light-emitting device according to the embodiment.

Figure 7:
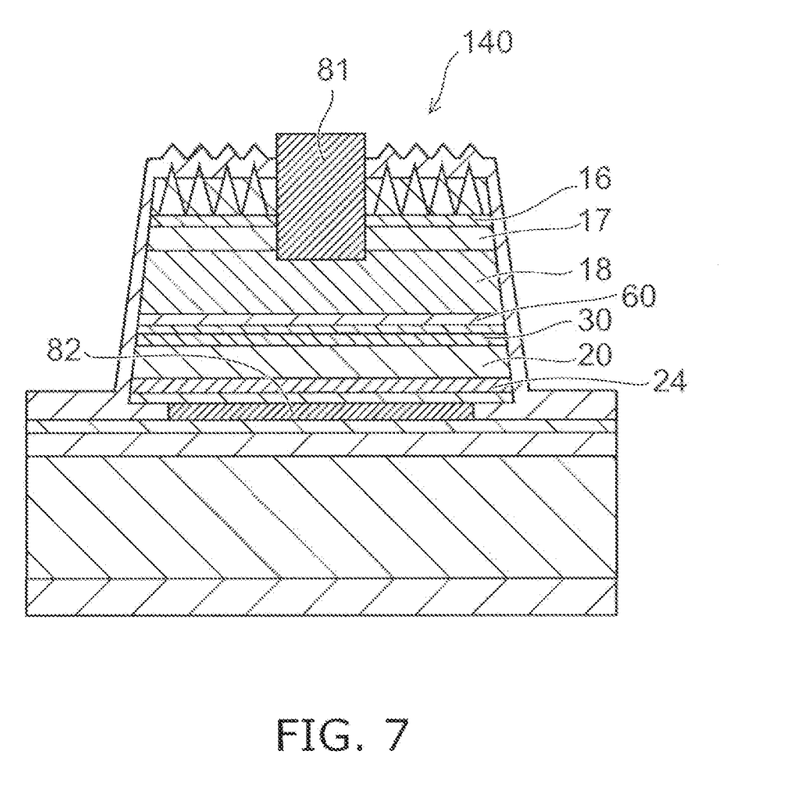
FIG. 7 is a cross-sectional schematic diagram illustrating still another example of the semiconductor light-emitting device according to the embodiment.

FIG. 7 is a cross-sectional schematic diagram illustrating still another example of the semiconductor light-emitting device according to the embodiment.

FIG. 6B is an enlarged photo of a range B1 illustrated in FIG. 6A.

A semiconductor light-emitting device 130 illustrated in FIG. 6A includes the second semiconductor layer 20, the MQW light emitting layer 30, the first semiconductor layer 10, the first stress application layer 16, the second stress application layer 22, the first electrode 81, and the second electrode 82 similarly to the semiconductor light-emitting device 110 described in relation with FIG. 1. The first semiconductor layer 10 has a structure in which the non-doped GaN layer 17 and the n-type GaN layer 18 are laminated. These are the same as described in relation with FIGS. 1 and 3.

As in a semiconductor light-emitting device 140 illustrated in FIG. 7, the SLS layer 60 made of a multilayer film of InGaN and GaN may be arranged on the MQW light emitting layer 30. Moreover, the second stress application layer may contain the SLS layer 24 made of an AlN multilayer film.

As illustrated in FIG. 6B, a light extraction layer is provided on the side opposite to the first semiconductor layer 10 of the first stress application layer 16. Projections and recesses are provided on the surface (light extraction surface) on the side opposite to the first stress application layer 16 of the light extraction layer. On the surface of the light extraction surface to which the roughening procedure is applied, a protective film 15 containing $SiO_2$ is formed. Moreover, in the semiconductor light-emitting device 130 illustrated in FIG. 6A, the uppermost layer (the layer on the side of the light extraction surface) and the first AlN layer 16 below the uppermost layer in the three layers of the AlN layers 16 included inside the crystal growth layer 70 (See FIG. 4A and the like) are separated by the roughening procedure on the semiconductor surface. On the other hand, the AlN layer 16 on the second layer below the uppermost layer is left as a continuous film on the side lower than the recess part.

The configuration of the AlN layer (first stress application layer) left as the continuous film is not limited to that. For example, as illustrated in FIG. 1, the roughening procedure on the light extraction surface with respect to the position of the AlN layer 16 on the uppermost layer may be shallow and all the AlN layers 16 may be left as the continuous films.

As described above, since any of the plurality of layers of the AlN layers 16 is left as a continuous film, the AlN layer 16 can apply the compressive stress to the first semiconductor crystal layer. As a result, deterioration of the device characteristics caused by occurrence of a crack or introduction of a defect can be suppressed, and a semiconductor light-emitting device with high light emitting efficiency can be provided.

That is, the thickness of AlN required as the first stress application layer 16 is 15 nm or more if the AlN layer is a single layer. Moreover, the AlN layer may be in plural. If the plurality of layers of AlN adjoin each other, it is only necessary that the total thickness is 15 nm or more.

Moreover, in the semiconductor light-emitting device 130 illustrated in FIG. 6A, the first semiconductor layer 10 is composed of the non-doped GaN layer 17 having a thickness of 1 μm and the n-type GaN layer 18 having a thickness of 2 μm, which makes the total thickness of 3 μm, but the thickness of AlN required as the first stress application layer 16 depends on the thickness of this first semiconductor layer 10. That is, if the thickness of the first semiconductor layer 10 is small, the thickness of the first stress application layer 16 may be small. More specifically, if the first semiconductor layer 10 is made of the n-type GaN layer having a thickness of 2 μm, it is only necessary that the thickness of AlN of the first stress application layer 16 is 10 nm or more.

Moreover, the first stress application layer 16 may be formed of an AlGaN layer. If the first stress application layer 16 is formed of AlGaN, it is only necessary that a relationship between its Al composition and a thickness is equal to the thickness of an equivalent AlN layer. That is, if the thickness of the first semiconductor layer 10 is 3 μm, it is only necessary that the thickness of AlGaN is 30 nm or more so that the AlGaN layer having the Al composition of 50% is made the first stress application layer 16. Moreover, the first stress application layer 16 may be formed of a composite layer of AlN and AlGaN or a plurality of AlGaN having compositions different from each other. In that case, too, the required thickness can be estimated from the thickness of equivalent AlN.

The first stress application layer 16 is provided on the side of the light extraction surface which is an open surface, while the second stress application layer 22 is formed in contact with the second semiconductor layer 20 arranged on the side in contact with the reflective metal 90 and the junction metal. That is, since the second semiconductor layer 20 is fixed by the reflective metal 90 film, it is more difficult for a crack or a defect to be introduced in the second semiconductor layer 20 than in the first semiconductor layer 10. Thus, the thickness of the equivalent AlN layer required for the second stress application layer 22 is smaller than the thickness of the equivalent AlN layer required for the first stress application layer 16. As the second stress application layer 22 of the semiconductor light-emitting device 130 illustrated in FIG. 6A, an AlGaN layer having a thickness of 5 nm and Al composition of 20% is used. Moreover, as the second stress application layer of the semiconductor light-emitting device 140 illustrated in FIG. 7, an SLS layer (3 cycles) 24 sandwiching an AlGaN layer having a thickness of 3 nm and Al composition of 15% with a GaN layer having a thickness of 3 nm is used. The second stress application layer may be an AlGaN layer having Al composition of 10% and a thickness of 5 nm. Moreover, the second stress application layer 22 may be omitted.

If the compressive stress cannot be applied by the first stress application layer 16 to the first semiconductor layer 10, the device characteristics deteriorate due to generation of a crack or introduction of a defect under an influence of the tensile stress. Moreover, these failures influenced by the tensile stress are remarkable if average In composition in the MQW light emitting layer 30 is high and an average lattice constant of the MQW light emitting layer 30 is large. Moreover, the failures influenced by the tensile stress are also remarkable if the thickness of the MQW light emitting layer 30 is large.

Specifically, if the In composition of the well layer 32 made of the InGaN layer is 16% and the thickness of the well layer 32 is larger than 3.5 nm in the MQW light emitting layer 30 and also, if the thickness of the barrier layer 34 made of the GaN layer is smaller than 10.5 nm, the failure influenced by the tensile stress becomes remarkable. Under the above-described conditions, the average In composition is 4.0%. Here, in the specification of this application, the "average In composition" refers to a ratio expressed by $(t1 \times x1 + t2 \times x2)/(t1 + t2)$ when it is assumed that the thickness of the well layer 32 is t1, the In composition in the well layer 32 is x1, the thickness of the barrier layer 34 is t2, and the In composition in the barrier layer 34 is x2. Moreover, if the number of well layers 32 is larger than 4 pairs under the above-described conditions, the failure influenced by the tensile stress becomes remarkable. This corresponds to the thickness of 56 nm or more in the case of the above-described MQW light emitting layer 30.

Moreover, if the In composition in the well layer 32 made of the InGaN layer is 12% and the thickness of the well layer 32 is larger than 3 nm in the MQW light emitting layer 30, and also if the thickness of the barrier layer 34 made of the GaN layer is smaller than 5 nm, the failure influenced by the tensile stress becomes further remarkable. Under the above-described conditions, the average In composition is 4.5%. Moreover, under the above-described conditions, if the number of well layers 32 is larger than 6 pairs, the failure influenced by the tensile stress becomes remarkable. This corresponds to the thickness of 48 nm or more in the case of the above-described MQW light emitting layer 30.

Furthermore, if InGaN containing In is used for the barrier layer 34 of the MQW light emitting layer 30, the failure caused by the tensile stress applied to the GaN layer also becomes further remarkable. In this case, too, risk of occurrence of a failure such as generation of a crack or introduction of a defect can be evaluated by the size of the average equivalent In composition.

The first electrode 81 penetrates the first stress application layer 16 and is electrically connected to the first semiconductor layer 10. In the second electrode 82, an extraction portion, not shown, is formed in a perpendicular direction (direction perpendicular to the page) with respect to the section expressed in FIG. 6A.

In this specification, the "nitride semiconductor" is assumed to include semiconductors having all the compositions obtained by changing composition ratios x, y, and z in the respective ranges in a chemical formula of $B_xIn_yAl_zGa_{1-x-y-z}N$ ($0 \leq x \leq 1$, $0 \leq y \leq 1$, $0 \leq z \leq 1$, $x+y+z \leq 1$). Moreover, in the above-described chemical formula, those further containing group-V elements other than N (nitrogen), those further containing various elements added for controlling various physical characteristics such as conductivity, and those further containing various elements contained unintentionally are assumed to be also included in the "nitrogen semiconductors".

The embodiment of the invention has been described by referring to specific examples. However, the invention is not limited to these specific examples. For example, regarding specific configurations of each element such as the light emitting layer, the semiconductor layer and the like included in the semiconductor light-emitting device, appropriate selection by those skilled in the art from a known range is also included in the scope of the invention as long as the invention can be similarly put into practice and the similar effects can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light-emitting device comprising:
a first conductivity type first semiconductor layer containing a nitride semiconductor crystal and having a tensile stress in a (0001) surface;
a second conductivity type second semiconductor layer containing a nitride semiconductor crystal and having a tensile stress in the (0001) surface;
a light emitting layer provided between the first semiconductor layer and the second semiconductor layer, containing a nitride semiconductor crystal, and having an average lattice constant larger than a lattice constant of the first semiconductor layer; and
a first stress application layer provided on a side opposite to the light emitting layer of the first semiconductor layer and applying a compressive stress to the first semiconductor layer.

2. The device according to claim 1, further comprising:
a second stress application layer provided on a surface on a side opposite to the light emitting layer of the second semiconductor layer and applying a compressive stress to the second semiconductor layer.

3. The device according to claim 2, wherein the second stress application layer contains $Al_{x2}Ga_{1-x2}N$ (0<x2<1).

4. The device according to claim 1, wherein the first stress application layer contains $Al_{x1}Ga_{1-x1}N$ (0<x1≤1).

5. The device according to claim 1, wherein the first semiconductor layer contains a nitride semiconductor layer not containing impurities.

6. The device according to claim 1, wherein the light emitting layer includes a plurality of barrier layers and a well layer provided between the plurality of barrier layers; and
the average lattice constant is a lattice constant obtained by weighting the lattice constant of the barrier layer and the lattice constant of the well layer with thickness distribution and by averaging the result.

7. The device according to claim 6, wherein
the well layer is provided in plurality, and
each well layer is disposed in each space between the barrier layers.

8. The device according to claim 1, wherein
an equivalent lattice spacing of silicon which becomes a crystal substrate on which a crystal layer of at least either of the first semiconductor layer and the second semiconductor layer is grown is larger than the lattice constant of the first semiconductor layer.

9. The device according to claim 8, wherein
a thermal expansion coefficient of a crystal of silicon which becomes a crystal substrate on which a crystal layer of at least either of the first semiconductor layer and the second semiconductor layer is grown is smaller than the thermal expansion coefficient of the first semiconductor layer.

10. The device according to claim 1, wherein
an equivalent lattice spacing of silicon which becomes a crystal substrate on which a crystal layer of at least either of the first semiconductor layer and the second semiconductor layer is grown is larger than the lattice constant of the second semiconductor layer.

11. The device according to claim 10, wherein
a thermal expansion coefficient of a crystal of silicon which becomes a crystal substrate on which a crystal layer of at least either of the first semiconductor layer and the second semiconductor layer is grown is smaller than the thermal expansion coefficient of the second semiconductor layer.

12. The device according to claim 1, wherein
the light emitting layer has a layer including In, and
an average In composition of the light emitting layer is 4.0% or more, and
a thickness of the light emitting layer is 56 nanometers or more.

13. The device according to claim 1, wherein
the light emitting layer has a layer including In, and
an average In composition of the light emitting layer is 4.5% or more, and
a thickness of the light emitting layer is 48 nanometers or more.

14. The device according to claim 1, further comprising:
a support substrate provided on the side opposite to the light emitting layer of the second semiconductor layer, and the support substrate supporting the first stress application layer, the first semiconductor layer, the light emitting layer, and the second semiconductor layer.

15. The device according to claim 1, further comprising:
a first electrode penetrating the first stress application layer and being electrically connected to the first semiconductor layer.

16. The device according to claim 1, further comprising:
a second electrode electrically connected to the second semiconductor layer.

17. The device according to claim 16, further comprising:
a reflective metal provided on the second semiconductor layer, wherein
the second electrode is electrically connected to the second semiconductor layer through the reflective metal.

18. The device according to claim 1, further comprising:
a light extraction layer provided on the side opposite to the first semiconductor layer of the first stress application layer, wherein
an unevenness is provided on the surface on the side opposite to the first stress application layer of the light extraction layer.

19. The device according to claim 18, wherein
the first stress application layer includes a plurality of layers; and
at least one of the layers included in the first stress application layer is not separated by the unevenness and is present as a continuous layer.

20. The device according to claim 1, wherein
light emitted from the light emitting layer is projected to the outside through the first semiconductor layer and the first stress application layer.

* * * * *